Figure 1:
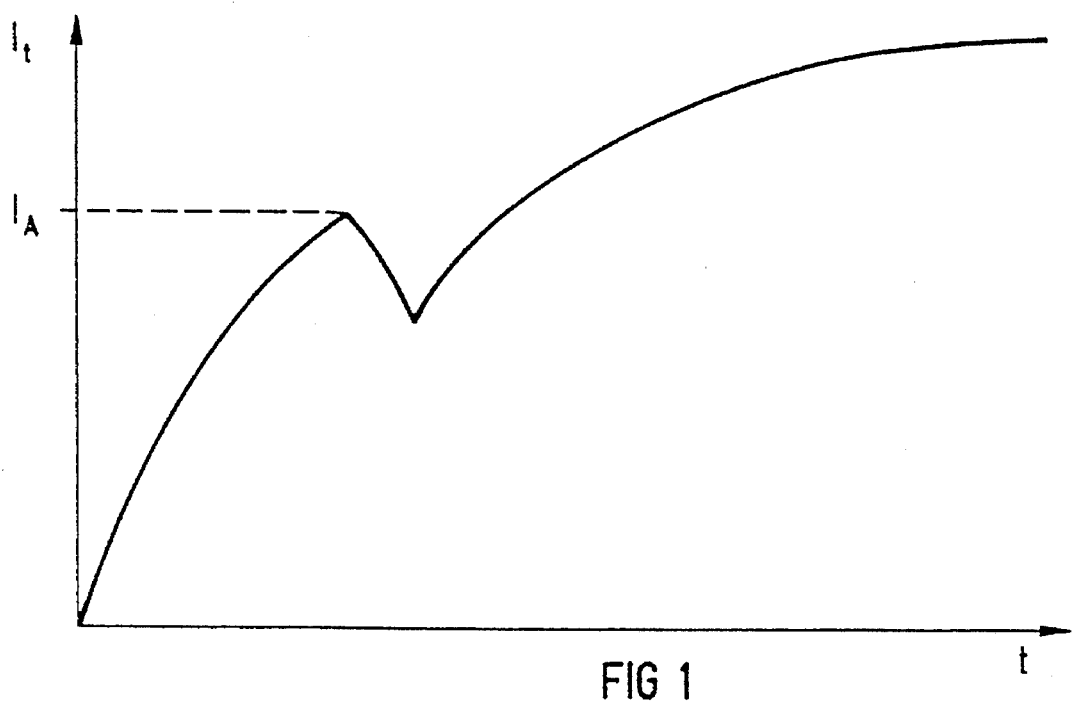

United States Patent [19]

Kempf et al.

[11] Patent Number: 5,492,009
[45] Date of Patent: Feb. 20, 1996

[54] METHOD AND APPARATUS FOR TESTING A VALVE ACTUATED BY AN ELECTROMAGNET HAVING AN ARMATURE

[75] Inventors: Burkhard Kempf, Mömbris; Hans-Joachim Klotz, Goldbach, both of Germany

[73] Assignee: Siemens Aktiengesellschaft, Munich, Germany

[21] Appl. No.: 153,776

[22] Filed: Nov. 17, 1993

Related U.S. Application Data

[63] Continuation-in-part of Ser. No. 849,526, Mar. 11, 1992, abandoned.

[30] Foreign Application Priority Data

Mar. 11, 1991 [DE] Germany .......................... 41 07 813.6

[51] Int. Cl.⁶ .......................... G01R 31/00; G01R 19/00; G01L 1/00; F16K 37/00
[52] U.S. Cl. .......................... 73/168; 73/1 B; 73/862.68; 137/551; 324/202; 324/415; 364/571.04
[58] Field of Search .......................... 324/202, 415, 324/418, 423, 537, 545, 546, 71.1; 340/644; 73/1 B, 168, 862.68; 137/551, 553, 554, 559; 364/571.01, 571.04, 571.07

[56] References Cited

U.S. PATENT DOCUMENTS

| | | |
|---|---|---|
| 3,988,664 | 10/1976 | Beery et al. . |
| 4,319,193 | 3/1982 | Boccali et al. .......................... 324/418 |
| 4,870,364 | 9/1989 | Trox et al. .......................... 324/418 |
| 4,990,854 | 2/1991 | Friz .......................... 324/418 |
| 5,182,517 | 1/1993 | Thelen et al. .......................... 324/418 |
| 5,256,973 | 10/1993 | Thee et al. .......................... 324/418 |

FOREIGN PATENT DOCUMENTS

| | | |
|---|---|---|
| 248722 | 8/1966 | Austria . |
| 011952 | 6/1980 | European Pat. Off. . |
| 2301830 | 9/1976 | France . |
| 3150814 | 6/1983 | Germany . |
| 3151757 | 7/1983 | Germany . |
| 3708892 | 9/1988 | Germany . |
| 3741734 | 6/1989 | Germany . |
| 3835677 | 4/1990 | Germany . |
| 58-190778 | 11/1990 | Japan . |

*Primary Examiner*—Gerard R. Strecker
*Attorney, Agent, or Firm*—Herbert L. Lerner; Laurence A. Greenberg

[57] ABSTRACT

A method for testing a valve being driven by an electromagnet having a electromagnet armature, includes determining a value of current in the electromagnet as a response current, at an instant when motion of the electromagnet armature of the valve begins during a switching action of the valve. A force acting through the electromagnet upon the electromagnet armature is determined from the determined response current, at the instant when motion of the electromagnet armature begins, by means of a calibration function, as a response force and as a standard for the condition of the valve. An apparatus for testing a valve being driven by an electromagnetic having a electromagnet armature and an electrical circuit, includes a current meter in the electrical circuit of the electromagnet. A computer is connected to the current meter. A memory for a calibration function is connected to the computer for indicating a dependency of a force acting upon the electromagnet armature on a current in the electrical circuit of the electromagnet.

16 Claims, 2 Drawing Sheets

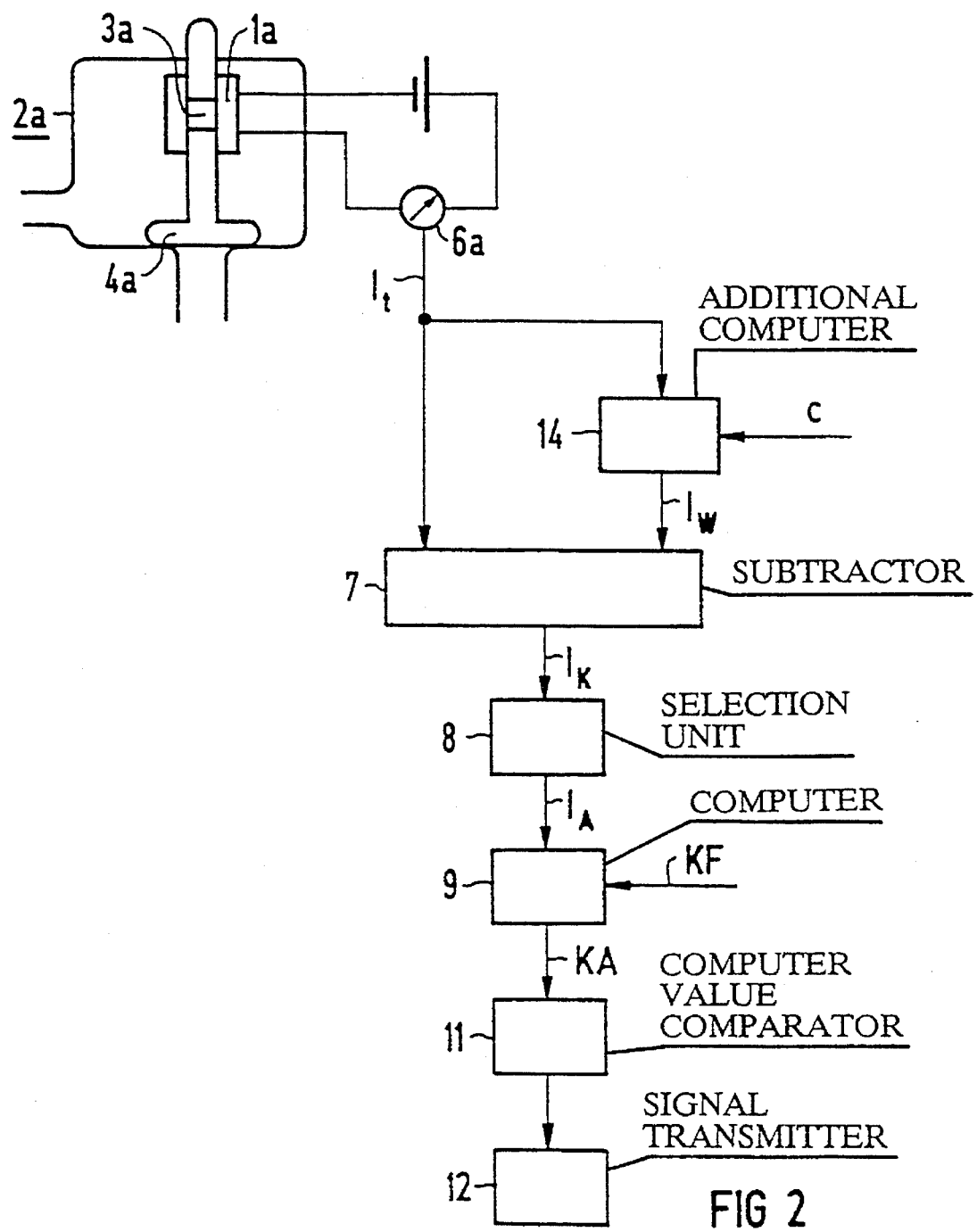

METHOD AND APPARATUS FOR TESTING A VALVE ACTUATED BY AN ELECTROMAGNET HAVING AN ARMATURE

CROSS-REFERENCE TO RELATED APPLICATION

This is a continuation-in-part of application Ser. No. 07/849,526, filed Mar. 11, 1992, now abandoned.

SPECIFICATION

The invention relates to a method for testing a valve driven by an electromagnet that has a electromagnet armature. It also relates to an apparatus for testing such a valve.

Electromagnet-driven valves can change their operating behavior. This can be ascribed to wear of mechanically moved parts and can cause impairment of a sealing and in an extreme case failure of the valve.

It is therefore necessary for all safety-relevant valves to be repeatedly checked for their functional capability. This is especially true for valves in a nuclear reactor system.

Previously, in order to check the functional capability of a valve, the electrical circuit supplying it was switched on and off, and it was then determined whether the valve closed or opened.

It is accordingly an object of the invention to provide a method and an apparatus for testing a valve, which overcome the hereinafore-mentioned disadvantages of the heretofore-known methods and devices of this general type and which evaluate the functional capability of the valve by using a variable with which a statement that is always reliable can be made.

With the foregoing and other objects in view there is provided, in accordance with the invention, a method for testing a valve being driven by an electromagnet having an electromagnet armature, which comprises determining a value of current in the electromagnet as a response current, at an instant when motion of the electromagnet armature of the valve begins during a switching action of the valve; and determining a force acting through the electromagnet upon the electromagnet armature from the determined response current, at the instant when motion of the electromagnet armature begins, by means of a calibration function, as a response force and as a standard for the condition of the valve.

As a rule, the electromagnet armature is coupled to a closure element or blind of the valve.

Through the use of the previously determined calibration function, the force exerted by the electromagnet on the closure element can advantageously be determined for the moment at which the motion of the closure element begins. The value of this so-called response force can be determined quickly and reliably by simple means. Moreover, the response force is very well-suited for a reliable statement as to the condition of the valve. If the response force deviates from a reference value, then maintenance or even replacement of the tested valve must be performed.

In accordance with another mode of the invention, in order to determine the response current, there is provided a method which comprises determining the curve of the current as a function of the electromagnet, for instance during a switching action of the valve and for instance when the rated voltage of the valve is applied, and determining the current at the first discontinuity as the response current, from this curve.

This can be accomplished since the curve of the current initially increases continuously after the application of a voltage to the electromagnet, and then exhibits a first discontinuity whenever the motion of the electromagnet armature and the closure element begins. The curve of the current has a second discontinuity once the motion of the electromagnet armature is ended. Between the two discontinuities, the curve of the current may drop for a brief period of time. After the second discontinuity, the curve of the current rises continuously once again, until it attains a constant value. Accordingly, the curve of the current over time exhibits a first discontinuity, which is equivalent to the response current.

In accordance with a further mode of the invention, there is provided a method which comprises differentiating the curve of the current, and determining the first discontinuity in the differentiated curve of the current. The discontinuity in the differentiated curve of the current is more clearly recognizable than the discontinuity in the curve of the current. The response current is then the current at the instant of the first discontinuity in the differentiated curve of the current.

In typical turn-on actions, the current increases quickly. Eddy currents arise, which influence the functional relationship between force and current. In order to correct this influence, in accordance with an added mode of the invention, there is provided a method which comprises decreasing the current measured in the electromagnet of the valve to be tested by the eddy current, which is a function of the current and the variation over time of the current.

The eddy current can also include other leakage currents. In accordance with an additional mode of the invention, there is provided a method which comprises determining the eddy current by measuring not only the current but, for instance, the variation in the current as well. With the aid of a correction factor, the eddy current can then be determined and thus the current can be corrected.

With the correction, an advantage is attained which is that in a fast current increase in the electromagnet, and even if the voltage deviates markedly from the rated voltage, the force on the moving parts of the valve, and in particular the response force, can be determined. If a high voltage is applied, the current increase is in fact greater than when a low voltage is applied.

In order to determine the response force, the calibration function and the correction factor must be furnished. To this end, base measurements are necessary that precede the actual test and can, for instance, be carried out in a laboratory.

For instance, in accordance with yet another mode of the invention, there is provided a method which comprises ascertaining the calibration function for a generically identical or similar-type valve by measurement of the force acting upon an arrested electromagnet armature by means of a electromagnet, as a function of the current in the electromagnet.

In accordance with yet a further mode of the invention, there is provided a method which comprises ascertaining the calibration function by arresting moving parts in a generically identical or similar-type valve, for instance by means of a force meter, then applying an electrical voltage to the electromagnet and then slowly increasing the voltage, and isochronously recording the current rising with the voltage and the force generated by the electromagnet, and expressing the relationship between the force and the current as the calibration function.

This calibration function makes it possible to determine the instantaneously exerted force for any measured current value, if there are no eddy currents. Using the calibration function has the advantage that a simple measurement of current suffices to determine the force, and in particular the response force of the valve.

Since a valve that is generically identical to the valves to be tested later is used to ascertain the calibration function, the calibration function can be used unrestrictedly. However, a separate calibration function must be determined for each valve type to be tested.

Since the moving parts of the valve are arrested by a force meter in order to ascertain the calibration function, the exerted force can be measured exactly. Force values are obtained not only for current values below the response current but also for higher current values.

For instance, in accordance with yet an added mode of the invention, there is provided a method which comprises expressing the calibration function as a polynomial:

$$F = a_0 + a_1 \cdot I + a_2 \cdot I^2 + \ldots + a_n I^n$$

In this equation, F is the force of the electromagnet acting on the moving parts, I is the current in the electromagnet, and a is a polynomial coefficient. The calibration function found is well represented by a polynomial.

In order to correct the eddy current influences, the difference between the measured current $I_t$ and the eddy current $I_w$ should be inserted as the current I in the polynomial of the calibration function, which represents the functional relationship between the force upon the moving parts of the valve, on one hand, and the current in the electromagnet of the valve, on the other hand. Accordingly, as an eddy-current-corrected current $I_k$, the following should be inserted for I:

$$I_k = I_t - I_w.$$

It is known that the eddy current $I_w$ is proportional to the measured current $I_t$ and its variation over time, $dI_t/dt$. From this it can be concluded that $$I_w = c \cdot I_t \cdot dI_t/dt,$$

where c is the correction factor.

From these last two equations, by mathematical conversion for the corrected current $I_k$, it follows that, $$I_k = I_t \cdot (1 - c \cdot dI_t/dt).$$

This equation for the corrected current $I_k$ is inserted into the calibration function. As a result, the calibration function which is corrected in terms of the eddy current is obtained, and continues to be in the form of a polynomial.

In accordance with yet an additional mode of the invention, there is provided a method which comprises testing a valve by determining the correction factor c. To this end, first, in two steps, with two different constant voltages that are applied to the electromagnet, the curve of the current, the curve of the variation over time of the current, and the curve of the force of the turn-on action is determined in the generically identical valve arrested with a force meter. Accordingly, for each of the two voltages one curve of the current, one curve of the variation of the current, and one curve of the force over time are obtained.

In the ensuing description it is assumed that for an equal force, the corrected current $I_k$ that is corrected in terms of the eddy current must be the same. For a particular, identical force, the measured currents $I_t(U_1)$ and $I_t(U_2)$ and their variation $(dI_t/dt)U_1$ and $(dI_t/dt)U_2$ are therefore determined.

Since $I_k(U_1)$ and $I_k(U_2)$ are equal, it follows that:

$$I_t(U_1)(1 - c \cdot (dI_t/dt)U_1) = I_t(U_2)(1 - c \cdot (dI_t/dt)U_2).$$

For the correction factor, it follows that:

$$c = \frac{I_t(U_1) - I_t(U_2)}{(I_t \cdot dI_t/dt)U_1 - (I_t \cdot dI_t/dt)U_2}$$

The value found for the correction factor c should then be inserted into the equation for the corrected current $I_k$ and thus into the calibration function.

With the aid of the calibration function, the associated force K can be determined merely from the measured current $I_t$, and the response force KA can be determined merely from the response current $I_A$.

With the method of the invention, particularly with the expanded correction process, an advantage is attained which is that a reliable indication of the condition of a valve can be obtained solely with a simple measurement of current.

With the objects of the invention in view, there is also provided, in an assembly of a valve being driven by an electromagnet having an electromagnet armature and an electrical circuit, an apparatus for testing the valve, comprising a current meter in the electrical circuit of the electromagnet; a computer connected to the current meter; and a memory for a calibration function being connected to the computer for indicating a dependency of a force acting upon the electromagnet armature on a current in the electrical circuit of the electromagnet.

In the computer, the measured current is linked to the memorized calibration function, so that a value for the force is present at the output of the computer. This value is compared for deviation with a command value, and if there is a deviation then a signal is output, for instance by a signal transmitter. The memory for the calibration function may also be a movable memory, such as a diskette.

In accordance with another feature of the invention, the computer is connected to a display apparatus, such as a screen or a plotter, which are capable of displaying the curve over time of the current or the differentiated current. Any discontinuity, such as a maximum, shown on the display device, will be recognized by a person as a turn-on instant.

A cursor may be used for this purpose. The value of the current at the turn-on instant is determined in the computer. The force at the turn-on instant (response force) is then calculated for this turn-on current.

The turn-on current can also be automatically ascertained by a computer from the measured curve of the current, without a person having to study the curve of current.

With the expanded apparatus, the force that acts upon moving parts of the valve whenever the motion begins, is studied as a response force. This force provides an optimal indication as to the condition of the valve.

In accordance with a further feature of the invention, in order to correct the influence of an eddy current upon the measured current, a subtracter is used, which is connected to the output side of the current meter and as a rule is integrated with the computer. The associated eddy current value is delivered to another input of the subtractor. In order to determine this eddy current value, the current meter is connected to a computer to which a correction factor can also be supplied. The eddy current value is determined in the computer from this factor and from the current and the differentiated current.

In accordance with an added feature of the invention, there is provided a calibration apparatus, disposed in a laboratory, for instance, to ascertain the necessary calibration function. It has an identical or like-type valve, the moving parts of which, in particular its electromagnet armature or closure element or blind, are arrested by a force meter. The electromagnet of the generically identical valve is connected to a variable voltage transmitter. A current meter is located in the electrical circuit of the electromagnet. Otherwise the calibration apparatus is largely equivalent to the apparatus that is used to test a valve. Different voltages may be applied automatically or manually. For each voltage value, a pair of values for current and force is then determined, and from the pairs of values the calibration function is formed in a correlation element, which may be part of a computer. Downstream of the correlation element is the aforementioned memory for the calibration function. The memory may be a transportable memory, such as a diskette.

In accordance with a concomitant feature of the invention, in order to determine the correction factors, the force meter is connected directly, and the current meter of the aforementioned generically identical valve is connected directly and through a differentiator, to memories, in order to store in memory the current curves, the curves of the current variation, and the curves of force at the turn-on action for two different, constant voltages. The memories are connected to a selection and calculation unit for selecting the currents and current variations for the two voltages at a constant force and for calculating the correction factor. The differentiator, the memories and the selection and calculation unit may be part of a computer for determining the correction factor. Downstream of the selection and calculation unit or computer is a memory for the correction factor, for instance a transportable memory such as a diskette.

The correction factor can also be stored in memory on a data carrier for later use.

With the apparatus according to the invention for testing a valve driven by an electromagnet, an advantage is attained which is that once calibration has been done, only the curve of the current needs to be measured at the electromagnet. Nevertheless, a reliable statement as to the force acting upon the moving parts of the valve at the instant that motion begins, is obtained. This force permits an unequivocal statement to be made as to the instantaneous condition of the valve.

Other features which are considered as characteristic for the invention are set forth in the appended claims.

Although the invention is illustrated and described herein as embodied in a method and an apparatus for testing a valve, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 3:
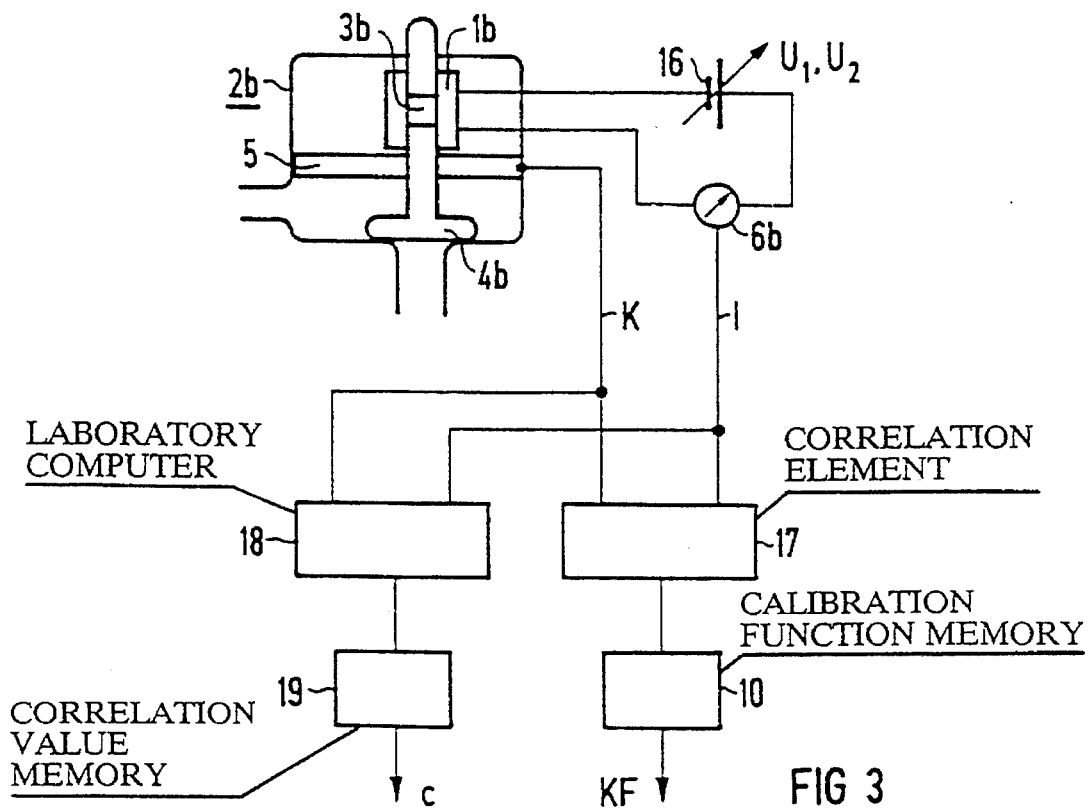

FIG. 1 is a graph showing a curve of a current $I_t$ in an electromagnet of a electromagnetically driven valve in a turn-on action over a time t;

FIG. 2 includes a schematic circuit diagram of an apparatus for testing a valve driven by an electromagnet and a diagrammatic elevational view of the valve and electromagnet; and FIG. 3 is a view similar to FIG. 2 including a circuit diagram of a laboratory apparatus for furnishing a calibration function and a correction factor.

Referring now to the figures of the drawing in detail and first, particularly, to FIGS. 1 and 2 thereof, it is seen that if a voltage is applied to an electromagnet 1a of an electromagnet-driven valve 2a as seen in FIG. 2, then the current $I_t$ in the electrical circuit of the electromagnet 1a initially rises as shown in FIG. 1. Once the motion of moving parts, for instance an electromagnet armature 3a or a closure element or blind 4a of the valve 2a begins, the current $I_t$ drops briefly, or after some discontinuity rises less quickly than before. Subsequently, after a further discontinuity, the current $I_t$ again rises as before and attains a constant value. In order to determine the so-called response current $I_A$, in other words the current at the instant when the motion of the moving parts of the valve 2a begins, it is sufficient to determine the first discontinuity or the maximum point in the curve of the current. To this end, the curve of the current is differentiated, and then the first discontinuity or the zero crossover is determined there. A force KA exerted upon response of the valve 2a is determined from the response current $I_A$, with a calibration function KF. This gives an optimal indication as to the functional capability of the valve 2a.

In order to determine the calibration function KF and a correction factor c, a valve 2b which is generically identical or of the same type is used, in which moving parts, for instance a closure element or blind 4b and a electromagnet armature 3b, are blocked by a force meter or transducer 5, as seen in FIG. 3.

A correction of the eddy current influences may be performed, in order to improve the accuracy of the evaluation.

In FIG. 2, the apparatus for valve testing according to the invention has a current meter 6a in the electromagnetic circuit of the valve 2a to be tested. In order to correct the influences of eddy currents, the current meter 6a is connected to one input of a subtractor 7, having another input which receives an eddy current value $I_w$. A corrected current $I_k$ is present at the output of the subtractor 7. In order to determine the response current $I_A$ of the valve 2a at which the motion of the valve 2a begins, an output of the subtractor 7 is connected to a selection unit 8. In the selection unit 8, a maximum point or a discontinuity of the curve of the current shown in FIG. 1 is determined. The response current $I_A$, which is corrected in terms of the eddy current, is present at the output of the selection unit 8. The output of the selection unit 8 is connected to a computer 9, to which the calibration function KF can be supplied from a memory 10 shown in FIG. 3. Instead of the selection unit 8, a screen or plotter unit may be used, with the aid of which a person can then make the selection of the response current $I_A$. The response current $I_A$ must then be read into the computer 9. The response force KA upon the moving parts, for instance upon the closure element 4a of the valve 2a, corresponding to the response current $I_A$, is present at the output of the computer 9. The output of the computer 9 is connected, for instance, through a command value comparator 11, to a signal transmitter 12, for instance, which indicates a deviation of the force value from a command value and thus provides an indication as to the condition of the valve 2a. The subtractor 7, the selection unit 8 or a screen, the computer 9, and so forth, can together form a higher-level computer.

In order to calculate the eddy current $I_w$, the current meter 6a is connected to an additional computer 14, which includes a differentiator and to which the correction factor c can be supplied. This computer 14 may be part of the higher-level computer.

As mentioned above, in FIG. 3, the valve 2b, which is generically identical to or of the same type as the valve 2a to be tested, is used in the laboratory to determine the calibration function KF. Again, in this generically identical valve 2b, the moving parts, for instance the closure element 4b or the electromagnet armature 3b, are blocked by the force meter 5. A current meter 6b and a variable voltage transmitter 16 are located in the electrical circuit of the electromagnet 1b. Both the force meter 5 and the current meter 6b communicate with a correlation element 17, in which the calibration function KF is determined from measured pairs of values for a force K and a current I. The correlation element 17 is connected to the memory 10 for the calibration function KF. The correlation element 17 may be a computer.

In order to determine the correction factor c, which is necessary for determining the eddy current $I_w$, the current meter 6b and the force meter 5 of the generically identical valve 2b, which are already used for determining the calibration function KF, are connected to a laboratory computer 18. There, current curves, differentiated current curves, and curves of the force are stored in memory for two different voltages $U_1$ and $U_2$ that are generated by the voltage transmitter 16. For a specific fixed force, two associated currents $Iu_1$ and $Iu_2$ are selected from the two current curves. Corresponding current variations $(dI_t/dt)u_1$ and $(dI_t/dt)u_2$ are selected from the two differentiated current curves. The correction factor c, which is necessary for the eddy current correction, is determined from these values. An output of the computer 18 is connected to a correction value memory 19. The computer 18 may include the correlation element 17. The computer 18 may have a screen or a plotter unit, with the aid of which a person can then read the values for the current $Iu_1$ and $Iu_2$ and for the current variation $(dI_t/dt)u_1$ and $(dI_t/dt)u_2$ off from curves. These values must then be entered into the computer 18. The laboratory computer 18 may be structurally identical to a computer that is used in testing the valve 2a.

With the method and with the apparatus shown for testing the valve 2a, it is advantageously possible, after determining the calibration function KF and the correction factor c, to reliably and accurately determine the force KA acting upon the moving parts of the valve 2a, for instance the closure element 4a of the valve 2a when the motion begins, merely from the current $I_t$ in the electrical circuit of the electromagnet 1a, which can be measured by simple means. This response force KA permits an unequivocal statement to be made as to the condition of the valve 2a.

The following section provides additional explanatory material, that provides further detail information of the operation of the invention.

The method and device according to the invention as shown in FIG. 2 makes it possible to determine the state of the valve 2a, and in that manner faulty operation of the valve 2a can be detected, even if failure may not occur until long time later. Advantageously it is possible to detect even a small faullt, and the valve 2a can therefore be replaced and repaired long before total failure may actually occur.

The valve 2a to be tested is a conventional valve capable of stopping flow of gases and fluids. To that end a closure element 4a is provided, which is formed of a disk and a spindle connected to the disk. With the disk it is possible to stop the flow of fluids or gases flowing through the valve 2a. In order to effect the closure the closure element 4a must be displaced so that an aperture in the valve 2a is closed. According to FIG. 2 the closure element 4a can be moved by means of an electromagnet 1a. The electromagnet 1a normally is composed of a coil surrounding the spindle of the closure element 4a. Since the spindle is usually not made of a magnetizable material, it is necessary to provide on or as part of the spindle an electromagnet armature 3a made of a magnetizable material. Only in that manner is it possible to move the closure element 4a.

FIG. 2 shows the valve 2a in the valve-closed state, i.e. flow through the valve 2a is prevented. In order to open the valve 2a, the closure element 4a must be raised by means of the electromagnet 1a and the armature 3a, for which a certain activating force KA, which is also called a response force $K_A$, is necessary.

The magnitude of this activating force $K_A$ depends on the state of the valve 2a. If a defect of the valve 2a is present, for example if the moving range of the closure element 4a is restricted, the activating force $K_A$ will exceed a certain permissible maximum value. In order to test the valve 2a, it must be determined if this activating force $K_A$ exceeds its permissible maximum value.

To that end a method is herein provided by means of which the activating force $K_A$ can be determined.

According to the invention, the activating force $K_A$ is determined on the basis of the so-called response current $I_A$ flowing through the electromagnet 1a at the time movement of the closure element 4a is initiated. In order to determine the activating force KA, a calibration function KF must be determined which makes it possible to determine the value of the activating force KA as a function of the response current $I_A$.

In order to obtain the calibration function KF for a given type of valve 2a to be tested, a similar (i.e. a generally identical) type of valve 2b is set up, in a laboratory, as shown in FIG. 3. In the valve 2b, the movable part, i.e. the closure element 4b is retained in a given position connected to a force-meter, or a force-gauge, i.e. a transducer 5. Next, while measuring a set of values of the current I in the current circuit of the electromagnet 1b, which is structurally identical to the electromagnet 1a, by means of a current gauge (e.g. amperemeter) 6b, the corresponding forces K acting on the closure element 4b by the electromagnet 1b are measured with the transducer 5. The corresponding force K and current values I are recorded by correlation element 17 and define the calibration function KF, which is stored in a calibration function memory 10. In a computer 9, shown in FIG. 2, to which the calibration function memory 10 is connected via line KF, the activating force $K_A$ can be determined as a function of the response current $I_A$.

In order to determine the response current $I_A$ the current $I_t$ in the electromagnet 1a is determined by means of a current gauge (e.g. amperemeter) 6a as a function of time t for the entire range of the current $I_t$. This curve of the current $I_t$ taken as a function of time t is shown in FIG. 1, wherein the time axis is shown as t. From this current vs. time curve $I_t$, it is seen that from the moment of switching on the current (at t=o) the current first rises, until exactly at the moment when the armature 3a responds and begins to move, i.e. when also the closure element 4a begins to move. At this moment a preliminary maximum value is reached, after which time the current $I_t$ briefly begins to decrease until it again begins to rise, as shown on the curve of the current $I_t$ in FIG. 1. At the moment when the current starts to decrease, the current value is $I_A$ which is the value of the response current $I_A$, the value of which is being sought.

In other words, the exact value $I_A$ of the response current can be determined from current $I_t$ vs. time curve $I_t$ by means of differentiating the measured current $I_t$ curve. It follows that the current value $I_A$ can be determined from the first derivative (i.e. differential quotient) of the curve of the current $I_t$, since it is well known that mathematically the first derivative of a function goes through zero when the curve of the current $I_t$ goes through a maximum (or minimum) and begins to decrease. It now follows that after determining the first derivative function, the response-time for the armature 1a can be determined simply by setting the first derivative equal to zero, i.e. the time when the current $I_t$ begins to decrease. This is the time at which the armature 3a just begins to respond, i.e. when the closure element 4a of the valve 2a begins to move. The current that was flowing, at this time is the response current $I_A$, and can be determined in a simple manner from the current $I_t$ vs. time curve, shown in FIG. 1. The response current value $I_A$ can now be used, by means of the calibration function KF, described above, to determine the activating force $K_A$. The operation described above for determining the response current $I_A$ is performed in the selection unit 8 of FIG. 2.

According to FIG. 2, it is possible to improve the accuracy of the measurement described above, by means of an eddy current correction. Such eddy currents $I_W$ distort the current measurements of the current meter 6a. To that end an eddy current value $I_W$ is determined, as shown in FIG. 2, from the measured current $I_t$ vs. time curve of FIG. 1 and a correction factor "C". The eddy current $I_W$ is subtracted from the measured current $I_t$, from which a corrected current curve $I_K$ is determined, which is then used instead of the measured curve $I_t$ for determining the response current $I_A$. The computation of the eddy current $I_W$ is performed by an additional computer 14, seen in FIG. 2, which also shows a subtractor 7 which operates to subtract the eddy current $I_W$ from the measured current.

The correction factor C is, according to FIG. 3, determined from the measured values of the force K acting on the laboratory armature 3b, as measured by the transducer 5, and from the current I, measured by the current meter 6b. The determination of the correction factor C is made in a laboratory computer 18, and the factor C is stored in a correction value memory 19. From the correction value memory 19 the correction factor C can be transmitted to the additional computer 14 in FIG. 2. The laboratory computer 18 is used to store two different current curves determined from two different voltages $U_1$ and $U_2$, the two respective differentiated current curves, and the two respective force curves. For a given fixed force, the respective currents $I_{U1}$ and $I_{U2}$ and the respective current changes (dI/dt) $U_1$ and (dI/dt) $U_2$ are determined from the curves. These values are then entered into the laboratory computer 18, where the correction factor C is determined. The laboratory computer 18 may actually be the same computer as the computer 14 in FIG. 2, that is used during the testing of the value 2a.

The subtracting element, i.e. subtractor 7, the selection unit 8, and the computer 9 and other components may advantageously all be combined into one general main computer.

According to the disclosed method and with the apparatus shown for testing a valve 2a, it is readily possible to reliably and precisely determine, with simple means for measuring the current $I_t$ in the electromagnet 1a, the activating force $K_A$, acting on the valve's movable parts, such as the closure element 4a and the armature 3a. This activating force provides a unique indication of the condition of the valve 2a.

We claim:

1. A method for testing a valve being driven by an electromagnet having an electromagnet armature, which comprises:

determining a value of measured current in the electromagnet as a response current, at an instant when motion of the electromagnet armature of the valve begins during a switching action of the valve; and determining by means of a calibration function determined from another valve of the same type a response force acting through the electromagnet upon the electromagnet armature from the determined response current at the instant when motion of the electromagnet armature begins, and wherein the response force, determined by means of the calibration function determined from the other valve is applied as a standard for the condition of the valve.

2. The method according to claim 1, which comprises determining a curve of the current in the electromagnet during a switching action of the valve, and determining the current at a first discontinuity of the curve of the current, as the response current.

3. The method according to claim 2, which comprises differentiating the curve of the current, and determining the current upon the first discontinuity of the differentiated curve of the current, as the response current.

4. The method according to claim 1, which comprises correcting an influence of an eddy current by decreasing the measured current by an eddy current, being proportional to the measured current and to the variation as a function of time of the measured current.

5. The method according to claim 4, which comprises determining the eddy current from the measured current, a variation as a function of time of the measured current and a correction factor.

6. The method according to claim 1, which comprises determining the calibration function of the other valve of the same type by measuring a force acting through an electromagnet of an arrested electromagnet armature of the other valve, as a function of the current in the electromagnet of the other valve.

7. The method according to claim 6, which comprises determining the calibration function by blocking the electromagnet armature of the other valve with a force meter; applying an electrical voltage to the electromagnet of the other valve, and then slowly increasing the electrical voltage; isochronously recording a current value generated by the applied voltage and a force measured by the force meter; and determining the force in relation to the current, as the calibration function.

8. The method according to claim 1, which comprises expressing the calibration function as a polynomial.

9. The method according to claim 5, which comprises determining the correction factor with the other valve, blocking with a force meter the armature of the other valve, applying the two different constant voltages U1 and U2 in succession to the electromagnet of the other valve; and measuring the curve of the current as a function of time, determining the curve of the variation $dI_t/dt$ of the current as a function of time, and measuring with the force meter the corresponding forces as a function of time, upon a turn-on action determining the instantaneous current values and the instantaneous current variation values $dI_t/dt$ from the curves for both constant voltages for forces of equal magnitude; and determining the correction factor from both pairs of $(dI_t/dt)U_1$ and $(dI_t/dt)U_2$ values.

10. In an assembly of a valve being driven by an electromagnet having an electromagnet armature and an electrical circuit of the electromagnet, connected to a voltage source, an apparatus for testing the valve, the apparatus comprising a current meter in the electrical circuit of the electromagnet; a computer connected to said current meter; and a memory for storing a calibration function being connected to said computer, the calibration function indicating a dependency of a force acting upon the electromagnet armature on a current measurement by said current meter in the electrical circuit of the electromagnet.

11. The apparatus according to claim 10, including a selection unit connected between said current meter and said computer for selecting the current value associated with a parameter selected from the group of parameters consisting of a discontinuity, or a maximum point in the curve of the current, or in the curve of the differentiated current in the electrical circuit.

12. The apparatus according to claim 11, including a differentiator element connected between said current meter and said selection unit.

13. The apparatus according to claim 11, including a subtractor having two inputs and an output, one of said inputs being connected to said current meter, an additional computer receiving a correction factor and having a differentiator element, said additional computer having an input connected to said current meter and an output carrying an eddy current being connected to the other of said inputs of said subtractor, and the output of said subtractor carrying a corrected current value and being connected to said selection unit.

14. The apparatus according to claim 10, including another valve of the same type as the first-mentioned valve, another electromagnet driving said other valve and having an electrical circuit of said electromagnet, and another electromagnet armature of said other electromagnet; a force meter arresting said other electromagnet armature; a variable voltage transmitter connected to said other electromagnet; another current meter in the electrical circuit of said other electromagnet; a correlator for ascertaining the calibration function, being connected to said force meter, and to said other current meter for forming a correlation function and being connected to said memory for the calibration function.

15. The apparatus according to claim 13, including another valve of the same type as the first-mentioned valve, another electromagnet driving said other valve and having an electrical circuit of said other electromagnet, and another electromagnet armature of said other electromagnet; a force meter arresting said other electromagnet armature; a variable voltage transmitter connected to said electrical circuit of said other electromagnet; another current meter in the electrical circuit of said other electromagnet; a correlator for ascertaining the calibration function, being connected to said force meter, and to said other current meter for forming a correlation function and being connected to said memory for the calibration function.

16. The apparatus according to claim 15, including a laboratory computer connected to said force meter and to said other current meter, said laboratory computer having means for storing in memory the curve of the current, of the current variation and of a force in a turn-on action for two different constant voltages, for a selection of two current values and two current value variation values for a constant force and for the two voltages, and for calculating the correction factor from the current values and the current variation values for the two voltage values and for the constant force, said laboratory computer having an output, and a memory for storing the correction factor, being connected to the output of said laboratory computer for furnishing the correction factor.

\* \* \* \* \*